United States Patent
Ogle, Jr. et al.

(10) Patent No.: US 6,306,777 B1
(45) Date of Patent: Oct. 23, 2001

(54) FLASH MEMORY HAVING A TREATMENT LAYER DISPOSED BETWEEN AN INTERPOLY DIELECTRIC STRUCTURE AND METHOD OF FORMING

(75) Inventors: Robert B. Ogle, Jr., San Jose; Arvind Halliyal, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/595,166

(22) Filed: Jun. 15, 2000

Related U.S. Application Data
(60) Provisional application No. 60/148,946, filed on Aug. 13, 1999.

(51) Int. Cl.[7] ............................................. H01L 21/8247
(52) U.S. Cl. .................... 438/763; 438/758; 438/761; 438/787; 438/791; 257/639; 257/640; 257/646; 257/649
(58) Field of Search .................................. 438/758, 761, 438/763, 787, 791; 257/639, 640, 646, 649

(56) References Cited

U.S. PATENT DOCUMENTS

| | | | | |
|---|---|---|---|---|
| 5,940,718 | * | 8/1999 | Ibok et al. ............................ | 438/440 |
| 6,235,586 | * | 5/2001 | Au et al. .............................. | 438/258 |

* cited by examiner

Primary Examiner—Charles Bowers
Assistant Examiner—Lisa Kilday
(74) Attorney, Agent, or Firm—LaRiviere, Grubman & Payne, LLP

(57) ABSTRACT

A flash memory structure and fabrication process whereby stacks of a first poly-crystalline or of an amorphous silicon material (polysilicon), having a bottom layer member of an interpoly dielectric stack, are processed for formation of a post-treatment layer over the bottom interpoly dielectric layer member. The post-treatment layer is essentially a solid material formed by a chemical reaction for purposes of improving the reliability of an interpoly dielectric stack and results in changes to the capacitor coupling ratio of the flash memory element and allows the use of new power supply and programming voltages. The post-treatment layer is formed by exposing the polysilicon stacks with the bottom interpoly dielectric layer member to a selected one of at least three ambient reagent gases. The selected ambient reagent gases and exposure of the semiconductor structure being performed in either a batch furnace, a single wafer rapid thermal anneal tool, or a plasma chamber. Then at least three ambient reagent gases are selected from a group of reagent gases consisting essentially of $N_2O/NO$, $O_2/H_2O/O_3$, and $NH_3/N_2$. Any of the ambient reagent gases may be selected and utilized in a selected fabrication tools for pre-treating the surface of the bottom interpoly dielectric stack member prior to forming the complete interpoly dielectric stack of the flash memory element. The subsequently formed interpoly dielectric stack being a modified ONO stack where the post-treatment layer is disposed between the bottom silicon dioxide layer and the silicon nitride and silicon dioxide layers.

10 Claims, 2 Drawing Sheets

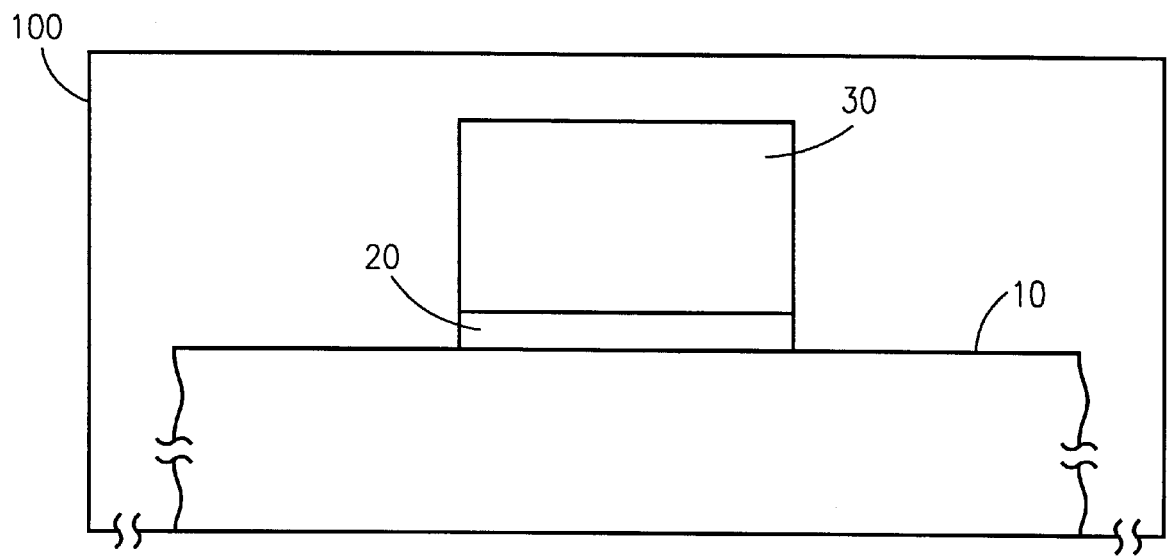
Figure 1.0
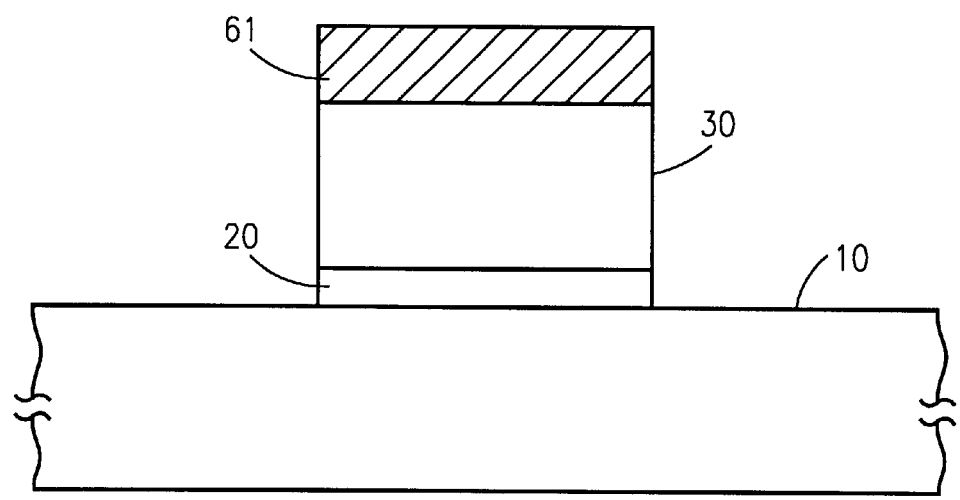
Figure 2.0

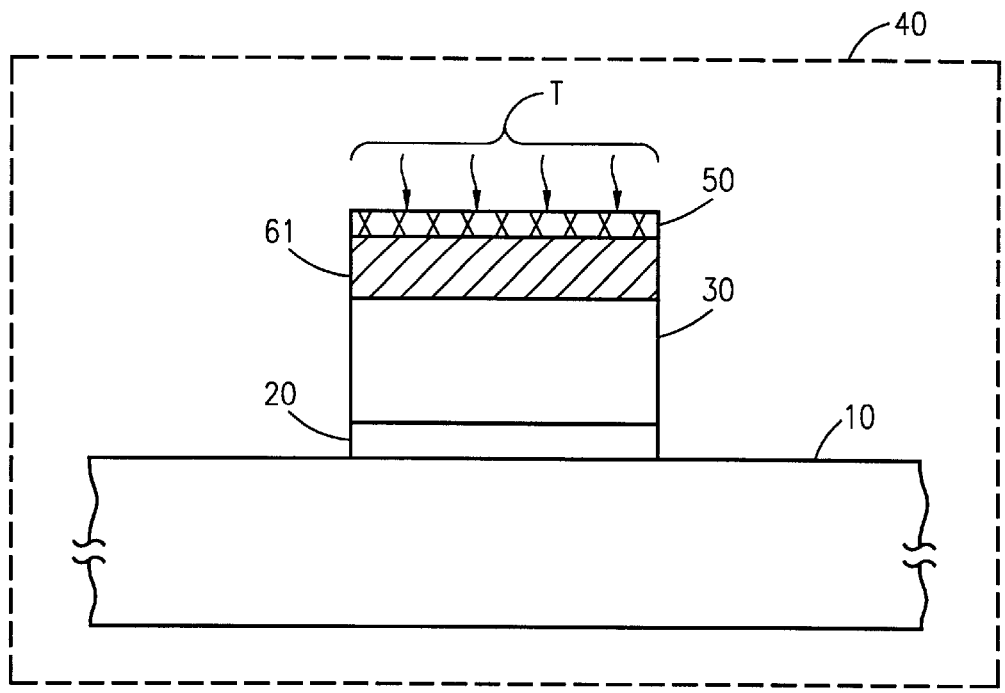
Figure 3.0
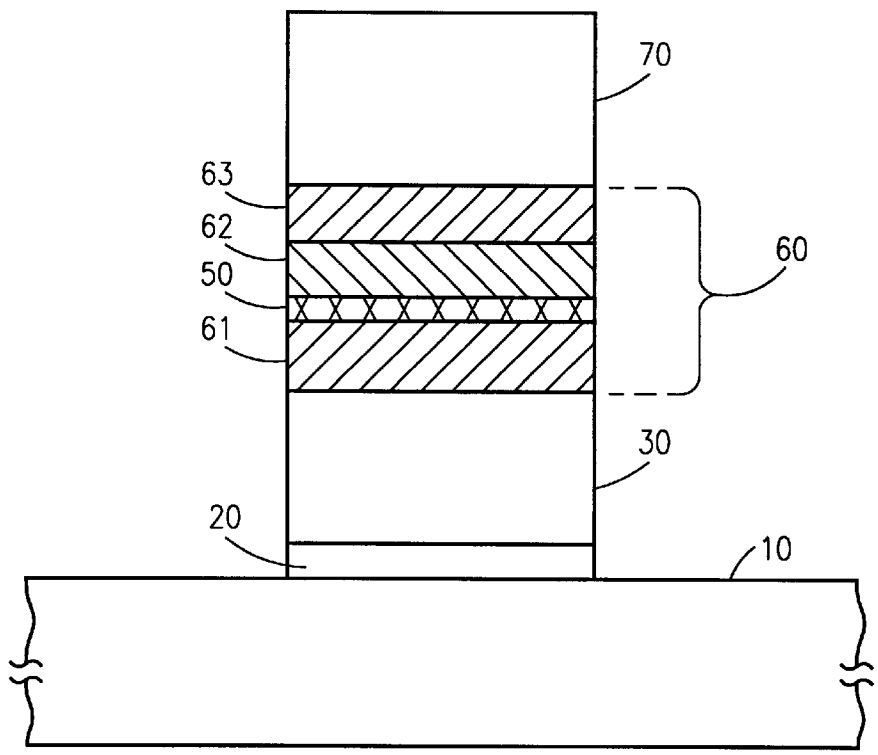
Figure 4.0

FLASH MEMORY HAVING A TREATMENT LAYER DISPOSED BETWEEN AN INTERPOLY DIELECTRIC STRUCTURE AND METHOD OF FORMING

RELATED APPLICATION

This application is related to co-pending U. S. Provisional Patent Application Ser. No. 60/148,946, entitled "FLASH MEMORY HAVING A TREATMENT LAYER DISPOSED BETWEEN AN INTERPOLY DIELECTRIC STRUCTURE AND METHOD OF FORMING," filed Aug. 13, 1999, by the same Applicants.

TECHNICAL FIELD

The present invention relates to integrated circuits and fabrication techniques for forming interpoly dielectric stacks used in flash memory technology. More particularly, the present invention relates to integrated circuits and fabrication techniques for forming "ONO" interpoly dielectric stacks used in flash memory technology. Even more particularly, the present invention relates to integrated circuits and fabrication techniques for improving the structural and electrical integrity, hence the reliability, of the bottom oxide layer of an "ONO" interpoly dielectric stack used in flash memory technology.

BACKGROUND OF THE INVENTION

The current state of the art in flash memory technology uses an interpoly dielectric stack typically consisting of the following layers: silicon dioxide (bottom), silicon nitride (middle), and silicon dioxide (top), known as an "ONO" (hereinafter referred to as ONO). The thickness of the ONO stack ranges from 100 Å to 300 Å, assuming a dielectric constant of 3.7 for the entire dielectric stack. The top oxide layer of the ONO stack is typically formed by thermal growth in an ambient steam. The middle nitride layer of the ONO stack is typically thinned during the formation of the top oxide layer. The bottom oxide layer of the ONO stack is exposed to the conditions arising from the formation of these two upper layers of the ONO stack. Accordingly, the electrical integrity of the bottom oxide layer is extremely critical to device performance. The thinning action acting on the previously formed oxide or nitride layer of the ONO stack introduces a problem: unreliable thickness determination of the completed ONO stack.

While U.S. Pat. Nos. 5,166,904 and 4,758,986 disclose texture asperities and roughness on polysilicon surfaces for the purpose of creating asymmetry in the structure to affect the electron tunneling and the magnitude of the tunneling threshold voltage, to Applicants' knowledge, no known flash memory fabrication process exists for forming nor flash memory structure exists having a specially formed treatment layer as a protective layer disposed between a bottom layer of a multi-layered interpoly dielectric stack prior to formation of the complete interpoly dielectric stack. In addition, no known flash memory fabrication process exists for forming nor flash memory structure exists, having a specially formed treatment layer, described supra, which both optimizes and improves structural and electrical characteristics of the subsequently formed interpoly dielectric stack, notwithstanding any adverse thinning action introduced by the dielectric stack fabrication process. Further, no known flash memory fabrication process exists for forming nor flash memory structure exists, having a specially formed treatment layer, supra, which both improves the reliability of the bottom oxide layer of an ONO interpoly dielectric stack and facilitates decreasing pf an ONO stack thickness, thereby resulting in capacitor coupling ratio changes of the flash memory element and, therefore, allowing the use of new power supply and programming voltages.

BRIEF SUMMARY OF THE INVENTION

Accordingly, the present invention provides a flash memory fabrication processes for forming and producing a flash memory structure having a specially formed treatment layer formed as a protective layer disposed between a bottom layer of a multi-layered interpoly dielectric stack prior to formation of the complete interpoly dielectric stack. The present invention also provides a flash memory fabrication process for forming and producing a flash memory structure having a specially formed treatment layer formed as a protective layer disposed between a bottom oxide layer member of an ONO interpoly dielectric stack that facilitates decreasing of ONO stack thickness, thereby resulting in changes to the capacitor coupling ratio of the flash memory element and allowing the use of new power supply and programming voltages. The present invention further provides a fabrication process for forming and producing a flash memory structure having a specially formed treatment layer formed as a protective layer disposed between a bottom oxide layer member of an ONO interpoly dielectric stack such that the characteristics of the subsequently formed ONO interpoly dielectric stack are optimized and improved, notwithstanding adverse thinning action caused by the dielectric stack fabrication process.

In particular, the flash memory structure of the present invention is formed via a fabrication process whereby, at a partially formed stage of a memory element, stacks of a first poly-crystalline silicon material or of an amorphous silicon (polysilicon) material, having an underlying thin film of silicon dioxide and a first (bottom) interpoly dielectric layer member formed overlying the first polysilicon material, are further processed to form a treatment layer, in accordance with the teachings of the present invention. The treatment layer will function as a protective layer for the bottom interpoly dielectric layer member and will be disposed between other interpoly dielectric layer members of a multi-layered interpoly dielectric stack, such as an ONO stack. The treatment layer can be termed post-treatment layer to distinguish from a pre-interpoly dielectric treatment layer taught in Applicants' co-pending related U.S. Provisional Patent Application, filed Aug. 13, 1999, Ser. No. 60/148,899, entitled "FLASH MEMORY HAVING PRE-INTERPOLY DIELECTRIC TREATMENT LAYER AND METHOD OF FORMING," referenced by Assignee's internal number D925, and hereby incorporated by reference. Instead of exposing the polysilicon stacks to a selected one of at least three ambient reagent gases (in accordance with known industry methods), the bottom interpoly dielectric layer member is first formed, and is then exposed to a selected one of at least three ambient reagent gases. The present invention distinguishes over the related art in that, rather than completing the interpoly dielectric stack, the bottom interpoly dielectric layer member is protected by the post-treatment layer of the present invention. The selected ambient reagent gases and exposure of the bottom interpoly dielectric layer member is performed in a fabrication tool such as a batch furnace, a single wafer rapid thermal anneal tool, or a plasma chamber. The at least three ambient reagent gases are grouped in an ambient reagent gases group consisting essentially of: (1) nitrous oxide ($N_2O$) and/or nitric oxide (NO), (2) oxygen ($O_2$) and/or water ($H_2O$), and (3) ammonia ($NH_3$). Any one ambient reagent gas may be selected and utilized in any of the foregoing fabrication tools for post-treating the surface of the bottom interpoly dielectric layer member prior to forming the other interpoly dielectric structure member of the flash memory element. Other features of the present invention are disclosed or are apparent in the section entitled "DETAILED DESCRIPTION OF THE INVENTION."

BRIEF DESCRIPTION OF DRAWINGS

FIG. 1 is a cross-sectional view of a flash memory semiconductor substrate shown at a fabrication stage having various memory regions formed to a first polysilicon stack stage, prior to formation of an interpoly dielectric layer, for further processing, in accordance with the present invention.

FIG. 2 is a cross-sectional view of the flash memory semiconductor substrate, depicted in FIG. 1, at a fabrication stage where a bottom interpoly dielectric layer member of a multi-layer interpoly dielectric stack, by example a bottom oxide layer of an ONO interpoly dielectric stack, has been formed in preparation for treatment, in accordance with the present invention.

FIG. 3 is a cross-sectional view of the flash memory semiconductor substrate, depicted in FIG. 1, in a representative fabrication chamber for formation of a protective treatment layer on a surface of a bottom interpoly dielectric layer member, in accordance with the present invention.

FIG. 4 is a cross-sectional view of the flash memory semiconductor substrate, depicted in FIG. 3, at a fabrication stage wherein the other layer members of an ONO interpoly dielectric stack and a second polysilicon layer have been formed over protective treatment layer formed in accordance with the present invention.

Reference numbers refer to the same or equivalent parts of the present invention throughout the several figures of the drawings.

DETAILED DESCRIPTION OF THE INVENTION

FIG. 1 illustrates a cross-section of a semiconductor substrate 10 shown at an early fabrication stage for forming a flash memory device, shown generally by the numeral 100. As depicted, substrate 10 has a silicon dioxide layer 20 and a first polysilicon layer 30 formed to a stage for forming an interpoly dielectric stack, by example a modified ONO stack 60, as shown in FIG. 4, which will be used in fabrication of a flash memory element member of flash memory device 100. In accordance with the present invention, as shown in FIG. 2, a bottom interpoly dielectric layer member 61 of a multi-layered interpoly dielectric stack 60, by example a bottom oxide layer 61 of a modified ONO stack 60, is formed in preparation for chemically treating its surface in accordance with the present invention. Instead of forming a related art interpoly dielectric stack, by example a traditional ONO interpoly dielectric stack, noteworthy at this stage of fabrication, the bottom dielectric layer member 61 undergoes the special surface treatment process of the present invention. Accordingly, as shown in FIG. 3, the semiconductor device manufactured, as shown in FIG. 2, undergoes a fabrication step, shown generally as treatment step T, in a fabrication chamber 40 for formation of a post-treatment layer 50. Post-treatment layer 50 improves the reliability of the subsequently formed interpoly dielectric layer, by example an modified ONO stack-layer 60. By having the post-treatment layer 50 on the surface of bottom interpoly dielectric layer member 61, any thinning action resulting during formation of the remaining layer members 62, 63 of the multi-layered interpoly dielectric stack 60, by example modified ONO interpoly dielectric layer 60, is withstood by the bottom oxide layer 61 due to the overlying post-treatment layer 50. The thinning action is deemed beneficial to the performance of the completed flash memory element, because the capacitor coupling ratio of the flash memory element increases, which allows the use of lower power supply and programming voltages. By example, a decrease in ONO thickness ranging from 5 to 30 Å would result in increasing the capacitor coupling ratio from 5 to 10% and a lowering of the power supply programming voltage by 2 to 10%. Treatment T can be performed in any one of three ambient reagent gas environments such as (1) nitrous oxide ($N_2O$) and/or nitric oxide (NO), (2) oxygen ($O_2$) and/or water ($H_2O$), and (3) ammonia ($NH_3$). Additionally, the treatment can take place in a batch furnace, a single wafer rapid thermal anneal (RTA) chamber, or in a plasma chamber. The setup required for each ambient in a particular fabrication chamber is as follows:

EXAMPLE 1. Ambient $N_2O$ and/or NO a. The treatment T of a first polysilicon stack 30 with a bottom interpoly dielectric layer member 61 in a batch furnace 40 comprises performing the process at an elevated temperature ranging from 800° C. to 1050° C. for a duration ranging from five (5) minutes to sixty (60) minutes in a gas mixture of at least one ambient reagent gas selected from a group of reagent gases consisting essentially of nitric oxide (NO) and nitrous oxide ($N_2O$), in a concentration ranging from 5 to 100 volume %, and at least one diluent gas selected from a group of diluent gases consisting essentially of argon (Ar), nitrogen ($N_2$), and oxygen (O), in a concentration balancing that of the selected at least one reagent gas, at a pressure ranging from 0.1 to 10.0 atmospheres;

b. The treatment T of a first polysilicon stack 30 with a bottom interpoly dielectric layer member 61 in a single wafer RTA tool 40 comprises performing the process at an elevated temperature ranging from 700° C. to 1150° C. for a duration ranging from one (1) second to one hundred twenty (120) seconds in a gas mixture of at least one ambient reagent gas selected from a group of reagent gases consisting essentially of nitric oxide (NO) and nitrous oxide ($N_2O$), in a concentration ranging from 1 to 100 volume %, and at least one diluent gas selected from a group of diluent gases consisting essentially of argon (Ar), nitrogen ($N_2$), and oxygen ($O_2$), in a concentration balancing that of the selected at least one reagent gas; or c. The plasma treatment T of a first polysilicon 30 with a bottom interpoly dielectric layer member 61 in a plasma chamber 40 would be performed in a nitrous oxide ($N_2O$) plasma for a duration ranging from one (1) second to one hundred twenty (120) seconds.

EXAMPLE 2. Ambient $O_2$ and/or $H_2O$ and/or $O_{03}$ a. The treatment T of a first polysilicon stack 30 with a bottom interpoly dielectric layer member 61 in a batch furnace 40 comprises performing the process at an elevated temperature ranging from 800° C. to 1050° C. for a duration ranging one (1) minute to twenty (20) minutes in a gas mixture of at least one ambient reagent gas selected from a group of reagent gases consisting essentially of oxygen ($O_2$) in a concentration ranging from 5 to 100 volume %, water ($H_2O$) in a concentration ranging from 5 to 100 volume %, and ozone ($O_{03}$)

in a concentration ranging from 5 parts per million (ppm) to 10 volume % and a diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres;

b. The treatment T of a first polysilicon stack 30 with a bottom interpoly dielectric layer member 61 in a single wafer RTA tool 40 comprises performing the process at an elevated temperature ranging from 700° C. to 1150° C. for a duration ranging from one (1) second to one hundred twenty (120) seconds in a gas mixture of at least one ambient reagent gas selected from a group of reagent gases consisting essentially of oxygen ($O_2$) in a concentration ranging from 1 to 100 volume %, water ($H_2O$) in a concentration ranging from 0.5 to 20 volume %, and ozone ($O_3$) in a concentration ranging from 5 parts per million (ppm) to 10 volume % and at least one diluent gas selected from a group of diluent gases consisting essentially of argon (Ar) and nitrogen ($N_2$), in a concentration balancing that of the selected at least one reagent gas; or c. The plasma treatment T of a first polysilicon 30 with a bottom interpoly dielectric layer member 61 in a plasma chamber 40 would be performed in at least one ambient reagent gas selected from a group of reagent gases consisting essentially of an oxygen ($O_2$) and an ozone ($O_3$) plasma for a duration ranging from one (1) second to one hundred twenty (120) seconds.

EXAMPLE 3. Ambient $NH_3$ and/or $N_2$ a. The treatment T of a first polysilicon stack 30 with a bottom interpoly dielectric layer member 61 in a batch furnace 40 comprises performing the process at an elevated temperature ranging from 800° C. to 1000° C. for a duration ranging from five (5) minutes to one hundred twenty (120) minutes in a gas mixture of a reagent gas selected from a group of reagent gases consisting essentially of ammonia ($NH_3$) in a concentration ranging from 5 to 100 volume %, and nitrogen ($N_2$) in a concentration of 100 volume % and at least one diluent gas selected from a group of diluent gases consisting essentially of argon (Ar) and nitrogen ($N_2$), in a concentration balancing that of the selected at least one reagent gas, at a pressure ranging from 0.5 to 10.0 atmospheres;

b. The treatment T of a first polysilicon stack 30 with a bottom interpoly dielectric layer member 61 in a single wafer RTA tool 40 comprises performing the process at an elevated temperature ranging from 700° C. to 1150° C. for a duration ranging from one (1) second to one hundred twenty (120) seconds in an ambient reagent gas ammonia ($NH_3$), in a concentration ranging from 1 to 100 volume %, and at least one diluent gas selected from a group of diluent gases consisting essentially of argon (Ar) and nitrogen ($N_2$), in a concentration balancing that of the selected at least one reagent gas; or c. The plasma treatment T of a first polysilicon 30 with a bottom interpoly dielectric layer member 61 in plasma chamber 40 would be performed in an ammonia ($NH_3$) plasma for a duration ranging from one (1) second to two (2) minutes.

Any one of the foregoing treatments of bottom interpoly dielectric layer member 61 will result in formation of a post-treatment layer 50. After the fabrication of post-treatment layer 50 in fabrication chamber 40, and as shown in the preferred embodiment in FIG. 4, the remaining interpoly dielectric layer members are formed over the post-treatment layer 50. By example, fabrication of the middle silicon nitride layer 62 and top silicon oxide layer 63 of the ONO stack 60 are completed. Subsequently, a second polysilicon layer 70 is formed as part of the process required for completion of the flash memory element, using techniques well known in the industry.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed is:

1. A method of fabricating a flash memory semiconductor apparatus, said method comprising the steps of:

a. providing a semiconductor substrate b. fabricating a silicon dioxide layer on at least one region of said substrate member;

c. depositing a silicon material over said silicon dioxide layer;

d. forming said silicon material and said silicon dioxide layer into at least one partial stack portion of a flash memory element, said silicon material formed into said at least one stack portion comprising a first polysilicon layer of said flash memory element;

e. forming a bottom interpoly dielectric stack member over said first polysilicon layer;

f. forming a post-treatment layer over said bottom interpoly dielectric stack member;

g. forming at least one other itnerpoly dielectric stack member over said post-treatment layer;

h. forming a second polysilicon layer over said interpoly dielectric member;

wherein said forming steps e, f, and g comprise:

forming a multi-layered interpoly dielectric member, said multi-layered interpoly dielectric member being formed such that said pre-interpoly dielectric treatment layer facilitates a thickness decrease ranging from 5 Å to 30 Å for said dielectric member, thereby increasing a capacitor coupling ration from 5% to 10% and lowering a power supply programming voltage by 2 to 10%.

2. A method of fabricating a flash memory semiconductor apparatus, as recited in claim 1, wherein:
   a. said step of forming a post-treatment layer over said bottom interpoly dielectric stack member comprises producing a solid material by a chemical reaction in a batch furnace, said chemical reaction comprises treating said bottom interpoly dielectric stack member in said batch furnace by heating said bottom interpoly dielectric stack member to an elevated temperature ranging from 800° C. to 1050° C. for a duration ranging from five (5) minute to sixty (60) minutes, exposing said heated bottom interpoly dielectric stack member to a gas mixture, and
   b. said gas mixture comprising at least one reagent gas selected from a group of reagent gases consisting essentially of nitric oxide (NO) in a concentration ranging from 5 to 100 volume % and nitrous oxide ($N_2O$) in a concentration ranging from 5 to 100 volume % and a diluent gas selected from a group of diluent gases consisting essentially of argon (Ar), nitrogen ($N_2$) and oxygen ($O_2$) in a concentration balancing that of the selected reagent gas, and pressurizing said batch furnace to a pressure ranging from 0.5 to 10.0 atmospheres.

3. A method of fabricating a flash memory semiconductor apparatus, as recited in claim 1, wherein:
   a. said step of forming a post-treatment layer over said bottom interpoly dielectric stack member comprises producing a solid material by a chemical reaction in a single wafer RTA tool, said chemical reaction comprises treating said bottom interpoly dielectric stack member in said RTA tool by heating said bottom interpoly dielectric stack member to an elevated temperature ranging from 700° C. to 1150° C. for a duration ranging from one (1) second to one hundred twenty (120) seconds exposing said heated bottom interpoly dielectric stack member to a gas mixture, and
   b. said gas mixture comprising a reagent gas selected from a group of reagent gases consisting essentially of nitric oxide (NO) in a concentration ranging from 1 to 100 volume % and nitrous oxide ($N_2O$) in a concentration of 100 volume % and a diluent gas selected from a group of diluent gases consisting essentially of argon (Ar), nitrogen ($N_2$) and oxygen ($O_2$) in a concentration balancing that of the selected reagent gas.

4. A method of fabricating a flash memory semiconductor apparatus, as recited in claim 1, wherein:
   said step of forming a post-treatment layer over said bottom interpoly dielectric stack member comprises producing a solid material by a chemical reaction in a plasma chamber, said chemical reaction comprises treating a surface of said bottom interpoly dielectric stack member in a nitrous oxide ($N_2O$) plasma for a duration ranging from one (1) second to one hundred twenty (120) seconds.

5. A method of fabricating a flash memory semiconductor apparatus, as recited in claim 1, wherein:
   a. said step of forming a post-treatment layer over said bottom interpoly dielectric stack member comprises producing a solid material by a chemical reaction in a batch furnace, said chemical reaction comprises treating said bottom interpoly dielectric stack member in said batch furnace by heating said bottom interpoly dielectric stack member to an elevated temperature ranging from 800° C. to 1050° C. for a duration ranging from one (1) minute to twenty (20) minutes, exposing said heated bottom interpoly dielectric stack member to in a gas mixture, and
   b. said gas mixture comprising at least one reagent gas selected from a group of reagent gases consisting essentially of oxygen ($O_2$) in a concentration ranging from 5 to 100 volume %, water ($H_2O$) in a concentration ranging from 5 to 100 volume %, and ozone ($O_3$) in a concentration ranging from 5 ppm to 10 volume % and at least one diluent gas selected from a group of diluent gases consisting essentially of argon (Ar), nitrogen ($N_2$), and oxygen ($O_2$) in a concentration balancing that of the selected reagent gas, and pressurizing said batch furnace to a pressure ranging from 0.5 to 10.0 atmospheres.

6. A method of fabricating a flash memory semiconductor apparatus, as recited in claim 1, wherein:
   a. said step of forming a post-treatment layer over said bottom interpoly dielectric stack member comprises producing a solid material by a chemical reaction in a single wafer RTA tool, said chemical reaction comprises treating said bottom interpoly dielectric stack member in said RTA tool at an elevated temperature ranging from 700° C. to 1150° C. for a duration ranging from one (1) second to one hundred twenty (120) seconds exposing said heated bottom interpoly dielectric stack member to a gas mixture, and
   b. said gas mixture comprising at least one reagent gas selected from a group of reagent gases consisting essentially of oxygen ($O_2$) in a concentration ranging from 1 to 100 volume %, water ($H_2O$) in a concentration ranging from 0.5 to 20 volume %, and ozone ($O_3$) in a concentration ranging from 5 ppm to 10 volume % and at least one diluent gas selected from a group of diluent gases consisting essentially of argon (Ar), nitrogen ($N_2$), and oxygen ($O_2$) in a concentration balancing that of the selected reagent gas.

7. A method of fabricating a flash memory semiconductor apparatus, as recited in claim 1, wherein:
   said step of forming a post-treatment layer over said bottom interpoly dielectric stack member comprises producing a solid material by a chemical reaction in a plasma chamber, said chemical reaction comprises treating a surface of said bottom interpoly dielectric stack member to a plasma selected from a plasma group consisting of an oxide ($O_2$) plasma and an ozone ($O_3$) plasma, said treatment lasting for a duration ranging from one (1) second to one hundred twenty (120) seconds.

8. A method of fabricating a flash memory semiconductor apparatus, as recited in claim 1, wherein:
   a. said step of forming a post-treatment layer over said bottom interpoly dielectric stack member comprises producing a solid material by a chemical reaction in a batch furnace, said chemical reaction comprises treating said bottom interpoly dielectric stack member in said batch furnace by heating said bottom interpoly dielectric stack member to an elevated temperature ranging from 800° C. to 1000° C. for a duration ranging from five (5) minutes to one hundred twenty (120) minutes, exposing said heated bottom interpoly dielectric stack member to a gas mixtue, and
   b. said gas mixture comprising a reagent gas selected from a group of reagent gases consisting essentially of ammonia ($NH_3$) in a concentration ranging from 5 to 100 volume % and nitrogen ($N_2$) in a concentration of 100 volume %, and pressurizing said batch furnace to a pressure ranging from 0.5 to 10.0 atmospheres.

9. A method of fabricating a flash memory semiconductor apparatus, as recited in claim 1, wherein:
   a. said step of forming a post-treatment layer over said bottom interpoly dielectric stack member comprises producing a solid material by a chemical reaction in a single wafer RTA tool, said chemical reaction comprises treating said bottom interpoly dielectric stack member in said RTA tool by heating said bottom interpoly dielectric stack member to an elevated temperature ranging from 700° C. to 1150° C. for a duration ranging from one (1) second to one hundred twenty (120) seconds, exposing said heated bottom interpoly dielectric stack member to a gas mixture, and
   b. said gas mixture comprising a reagent gas ammonia ($NH_3$) in a concentration ranging from 0 to 100 volume % and a diluent gas comprising nitrogen ($N_2$) in a concentration ranging from 0 to 100 volume % and balancing that of the reagent gas.

10. A method of fabricating a flash memory semiconductor apparatus, as recited in claim 1, wherein:

said step of forming a post-treatment layer over said bottom interpoly dielectric stack member comprises producing a solid material by a chemical reaction in a plasma chamber, said chemical reaction comprises treating a surface of said bottom interpoly dielectric stack member in an ammonia ($NH_3$) plasma for a duration ranging from one (1) second to one hundred twenty (120) seconds.

* * * * *

UNITED STATES PATENT AND TRADEMARK OFFICE
CERTIFICATE OF CORRECTION

PATENT NO.    : 6,306,777 B1
DATED         : October 23, 2001
INVENTOR(S)   : Robert B. Ogle, Jr. and Arvind Halliyal It is certified that error appears in the above-identified patent and that said Letters Patent is hereby corrected as shown below:

<u>Column 4,</u>
Line 33, delete "(O)" and replace with -- ($O_2$) --;
Line 56, delete "$O_{03}$" and replace with -- $O_3$ --;
Line 67, delete "($O_{03}$)" and replace with -- ($O_3$) --;

<u>Column 7,</u>
Line 1, delete "ration" and replace with -- ratio --.

Signed and Sealed this

Thirtieth Day of April, 2002

*Attest:*

JAMES E. ROGAN
*Attesting Officer*     *Director of the United States Patent and Trademark Office*